US012585842B2

(12) United States Patent
    Tokuyama

(10) Patent No.:  US 12,585,842 B2
(45) Date of Patent:      Mar. 24, 2026

(54) INFORMATION PROCESSING DEVICE, PROGRAM, AND INFORMATION PROCESSING METHOD

(71) Applicant: Yoshiteru Tokuyama, Tokyo (JP)

(72) Inventor: Yoshiteru Tokuyama, Tokyo (JP)

( * ) Notice:  Subject to any disclaimer, the term of this patent is extended or adjusted under 35 U.S.C. 154(b) by 1068 days.

(21) Appl. No.: 17/631,076

(22) PCT Filed: Jul. 31, 2020

(86) PCT No.: PCT/JP2020/029588
    § 371 (c)(1),
    (2) Date: Jan. 28, 2022

(87) PCT Pub. No.: WO2021/049202
    PCT Pub. Date: Mar. 18, 2021

(65) Prior Publication Data
    US 2022/0277114 A1      Sep. 1, 2022

(30) Foreign Application Priority Data
    Sep. 13, 2019    (JP) ................................. 2019-167641

(51) Int. Cl.
    *G06F 30/20*          (2020.01)
    *G06F 30/10*          (2020.01)
(52) U.S. Cl.
    CPC .............. *G06F 30/20* (2020.01); *G06F 30/10* (2020.01)
(58) Field of Classification Search
    CPC ........... G06F 30/20; G06F 30/10; G06F 30/23
    See application file for complete search history.

(56) References Cited

FOREIGN PATENT DOCUMENTS

| CN | 109544678 A | * | 3/2019 | ............. G06T 17/00 |
|---|---|---|---|---|
| JP | 62-072071 A | | 4/1987 | |
| JP | 6-259519 A | | 9/1994 | |
| JP | 8-315183 A | | 11/1996 | |
| JP | 2019-125022 A | | 7/2019 | |

OTHER PUBLICATIONS

Zheng C, Zhao F, Zhu L, Chen X. Analytical solution of volumetric flexibility through symbolic computation. Chemical Engineering Science. Aug. 10, 2021;239:116643. (Year: 2021).*
Zhang W, Wang Y, Zhan J, Liu B, Ning J. Parallel streamline placement for 2d flow fields. IEEE transactions on visualization and computer graphics. Aug. 9, 2012;19(7):1185-98. (Year: 2013).*
International Search Report issued on Sep. 29, 2020 in corresponding International Application No. PCT/JP2020/029588; 5 pages.

* cited by examiner

*Primary Examiner* — Chuen-Meei Gan
(74) *Attorney, Agent, or Firm* — Maier & Maier, PLLC

(57)              ABSTRACT
An information processing device is configured so as to execute a first division execution step, a physical computation step, and a second division execution step. The target data is mesh data, polygon data, or CAD data for an object or a space, and the regional division is computation for dividing the target data into a plurality of regions. In the first division execution step, first regional division of the target data is executed. In the physical computation step, physical computation is performed on the target data subjected to the first regional division. In the second division execution step, the result of the physical computation is used as a basis to determine a plurality of flow tubes, flow lines, or flow surfaces. In the second division execution step, second regional division is executed on the basis of the flow tubes, the flow lines, or the flow surfaces.

12 Claims, 9 Drawing Sheets

FIG. 5

FIRST MESH DECOMPOSITION

SECOND MESH DECOMPOSITION

INFORMATION PROCESSING DEVICE, PROGRAM, AND INFORMATION PROCESSING METHOD

TECHNICAL FIELD

The present invention relates to an information processing apparatus, a program, and an information processing method.

BACKGROUND

Many complex shapes and free-form surfaces are used in product shapes, such as vehicles and home appliances. In general, the free-form surfaces are represented as CAD vector data or three-dimensional polygon data (here, referred to as object data as a superordinate concept). On the other hand, when confirming product performance by physical simulation using finite element method, finite volume method, or the like for analysis, a different shape representation, i.e., mesh or other domains, is required.

PRIOR ART DOCUMENTS

Patent Document

[Patent Document 1] Patent Application Publication No. 2019-125022

SUMMARY

In order to decompose the object data into domains, it is necessary to consider size, shape, and quality of the domains, as well as compatibility of discretized approximation of partial differential equations. However, the current situation is that such decomposition has a strong know-how aspect, in which a skilled engineer conducts the decomposition based on his/her sense. If the domain is not properly decomposed, a large numerical diffusion occurs in the physical simulation, and the suitability is often deteriorated.

The present invention has been made in view of the above circumstances and provided a technology capable of executing domain decomposition on object data with less dependency and more appropriateness.

According to one aspect of the present invention, there is provided an information processing apparatus for decomposing object data into domains. The information processing apparatus configured to execute a first decomposition execution step, a physical operation step, and a second decomposition execution step. The object data is CAD data, polygon data, or mesh data of an object or a space, a domain decomposition is an operation of decomposing the object data into a plurality of domains. The first decomposition execution step is a step of executing a first domain decomposition on the object data. The physical operation step is a step of executing a physical operation on the object data for which the first domain decomposition is executed. The second decomposition execution step is a step of determining a plurality of stream tubes, streamlines, or stream surfaces based on a result of the physical operation, and executing a second domain decomposition based on the stream tube, the streamline, or the stream surface.

According to one form of the present invention, it is possible to implement domain decomposition on the object data with less dependency and more appropriateness.

BRIEF DESCRIPTION OF DRAWINGS

FIG. 5 is an example of drawing a streamline based on a result of the physical operation shown in FIG. 4.

DETAILED DESCRIPTION

Hereinafter, embodiments of the present invention will be described with reference to the drawings. Various features described in the embodiment below can be combined with each other.

A program for realizing a software in the present embodiment may be provided as a non-transitory computer readable medium that can be read by a computer, or may be provided for download from an external server, or may be provided so that the program can be activated on an external computer to realize functions thereof on a client terminal (so-called cloud computing).

In the present embodiment, the "unit" may include, for instance, a combination of hardware resources implemented by circuits in a broad sense and information processing of software that can be concretely realized by these hardware resources. Further, although various information is adopted in the present embodiment, this information can be represented, for example, by physical signal values representing voltage and current, by high and low signal values as a bit set of binary numbers composed of 0 or 1, or by quantum superposition (so-called quantum bit). In this way, communication/operation can be executed on a circuit in a broad sense.

Further, the circuit in a broad sense is a circuit realized by combining at least an appropriate number of a circuit, a circuitry, a processor, a memory, and the like. In other words, it is a circuit includes Application Specific Integrated Circuit (ASIC), Programmable Logic Apparatus (e.g., Simple Programmable Logic Apparatus (SPLD), Complex Programmable Logic Apparatus (CPLD), and Field Programmable Gate Array (FPGA)), and the like.

In the present embodiment, mesh means arbitrary mesh element, which is defined by arbitrary polyhedral cell defined in three dimensions surrounded by arbitrary polygonal faces. The number of faces in the cell is unlimited, and for those faces, the number of edges is also unlimited. A mesh element suitable for controlling numerical diffusion is a rectangular element in two dimensions, and a prismatic element in three dimensions, a typical example of which is a hexahedron. Domain refers to a domain to be analyzed, and domain decomposition means decomposing a domain into several subdomains with arbitrary boundary cross sections. Among domain decomposition, mesh decomposition in particular means to decompose a domain into several arbitrary mesh elements. Domain cutting means to cut an existing domain at an arbitrary boundary cross section and decompose it into several subdomains. Among domain cutting, mesh cutting (a type of mesh decomposition) in particular refers to cutting an existing mesh at an arbitrary boundary section and decomposing it into several arbitrary mesh elements.

1. Overall Configuration

In section 1, components comprised in the present embodiment will be described sequentially.

1.1 System 1

Figure 1:
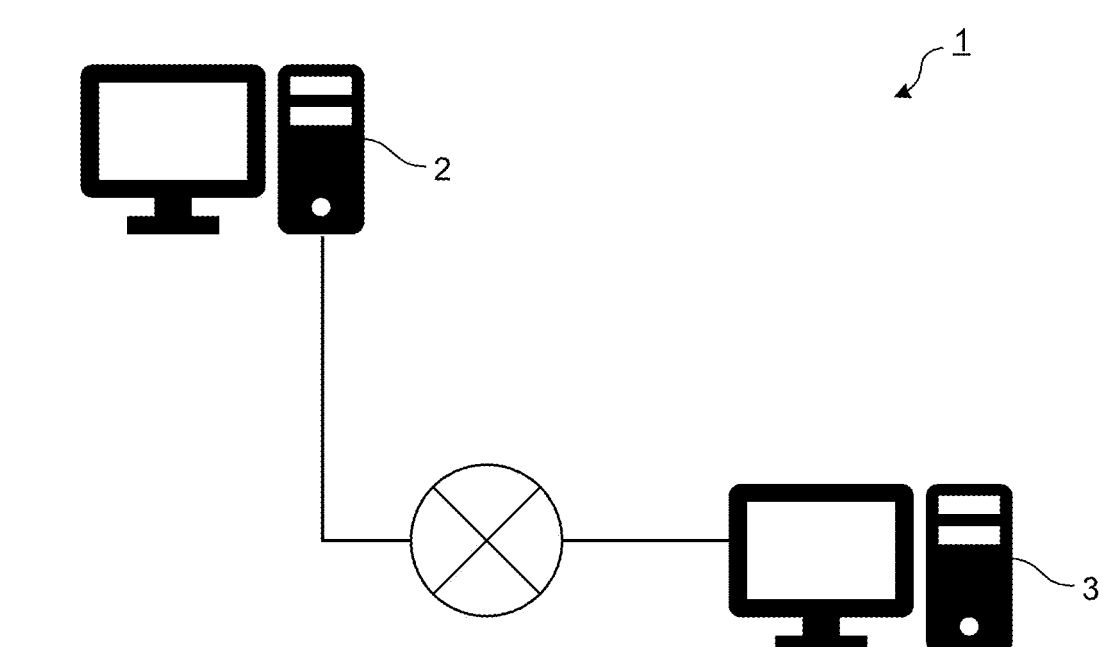
FIG. 1 is a block diagram showing a hardware configuration of a system.

FIG. 1 is a block diagram showing a hardware configuration summary of a system 1 according to the present embodiment. The system 1 comprises an object data generation apparatus 2 and an information processing apparatus 3. In the present embodiment, the object data generation apparatus 2 and the information processing apparatus 3 are connected via a network such as intranet or internet. Such a connection may be wired or wireless.

1.2 Object Data Generation Apparatus 2

The object data generation apparatus 2 is, for instance, a computer on which three-dimensional CAD software or polygon data generation software is installed as a program. These programs generate CAD data, polygon data, or mesh data, i.e., object data D, of an object or a space. Such object data D may be transmitted to the information processing apparatus 3 via a network, or may be transferred to the information processing apparatus 3 via other storage media or the like.

1.3 Information Processing Apparatus 3

The information processing apparatus 3 is realized by a computer which is a hardware, and a program which is a software. Such a program may be provided as a non-transitory computer readable medium that can be read by a computer (information processing apparatus 3), or may be provided as a downloadable program from an external server. Further, such a program can also be started by an external computer to implement so-called cloud computing, which can implement various functions at a client terminal.

In the present embodiment, the information processing apparatus 3 is configured to mesh decompose (domain decompose) the object data D. Here, the object data D is CAD data, polygon data, or mesh data of an object or a space. Mesh decomposition is an operation to decompose the object data D into a plurality of meshes M.

Figure 2A:
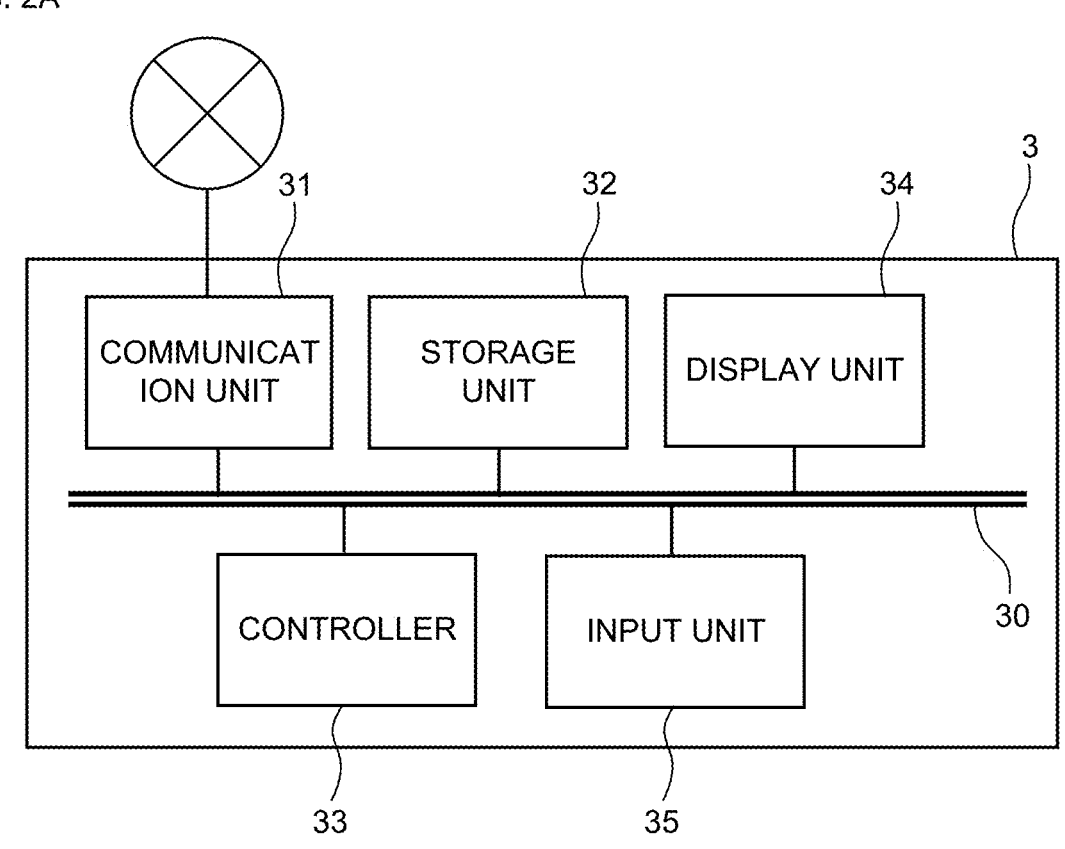
FIG. 2A is a block diagram showing a hardware configuration of an information processing apparatus.
Figure 2B:
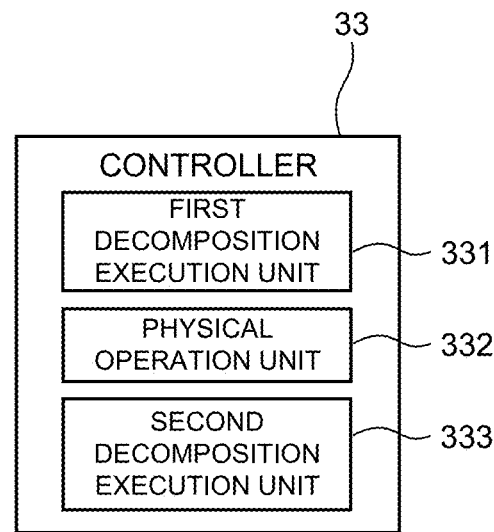
FIG. 2B is a functional block diagram showing function of a controller.

FIG. 2A shows a hardware configuration of the information processing apparatus 3, and FIG. 2B is a functional block diagram showing function of a controller 33. The information processing apparatus 3 comprises a communication unit 31, a storage unit 32, the controller 33, a display unit 34, and an input unit 35, and these components are electrically connected via a communication bus 30 inside the information processing apparatus 3. Each component will be further described hereinafter.

<Communication Unit 31>

Although wired communication means such as USB, IEEE1394, Thunderbolt, and wired LAN network communication are preferable, the communication unit 31 may include wireless LAN network communication, mobile communication such as LTE/3G, Bluetooth (registered trademark) communication or the like as necessary. The communication means illustrated above are only examples, and a dedicated communication standard may be adopted as well. In other words, it is more preferable to carry out as a set of a plurality of the aforementioned communication means.

In particular, by means of the communication unit 31, the information processing apparatus 3 is configured to communicate information with the object data generation apparatus 2 via a network, as shown in FIG. 1. For instance, the communication unit 31 receives the object data D generated by the object data generation apparatus 2 via the network. In other words, the communication unit 31 (an example of "reception unit") is configured to receive the object data D.

<Storage Unit 32>

The storage unit 32 is a volatile or non-volatile storage medium that stores various information. The storage unit 32 can be implemented, for instance, as a storage device such as a solid state drive (SSD), or as a memory such as a random access memory (RAM) that stores temporarily necessary information (argument, array, or the like) regarding program operation, or any combination thereof.

In particular, the storage unit 32 stores a program allowing a computer to function as the information processing apparatus 3. In addition, the storage unit 32 stores the object data D received by the communication unit 31 (reception unit).

<Controller 33>

The controller 33 processes and controls overall operation regarding the information processing apparatus 3. The controller 33 is implemented as, for instance, an unshown central processing unit (CPU). The controller 33 realizes various functions related to the information processing apparatus 3 by reading out a predetermined program stored in the storage unit 32. Specifically, the controller 33 executes the following functions: a first decomposition execution function that executes a first mesh decomposition, which is a random mesh decomposition, on the object data D; a physical operation function that executes physical operation on the object data D for which mesh decomposition has been executed; and a second decomposition function that determines a plurality of streamlines ST based on a result of the physical operation, and executes a second mesh decomposition based on the streamline ST and a normal line N substantially perpendicular thereto (surface in three-dimensional case, will be described as the normal line N for simplicity hereinafter), or the like.

In other words, the information processing by software (stored in the storage unit 32) is specifically realized by hardware (controller 33), in such a manner that the controller 33 may be executed as a first decomposition execution unit 331, a physical operation unit 332, and a second decomposition execution unit 333. In FIG. 2A, although it is described as a single controller 33, actually there is no particular limitation on it, and may be implemented with a plurality of controllers 33 for each function. Furthermore, combination thereof may also be implemented. Hereinafter, the first decomposition execution unit 331, the physical operation unit 332, and the second decomposition execution unit 333 will be further described in detail.

[First Decomposition Execution Unit 331]

Figure 3A:
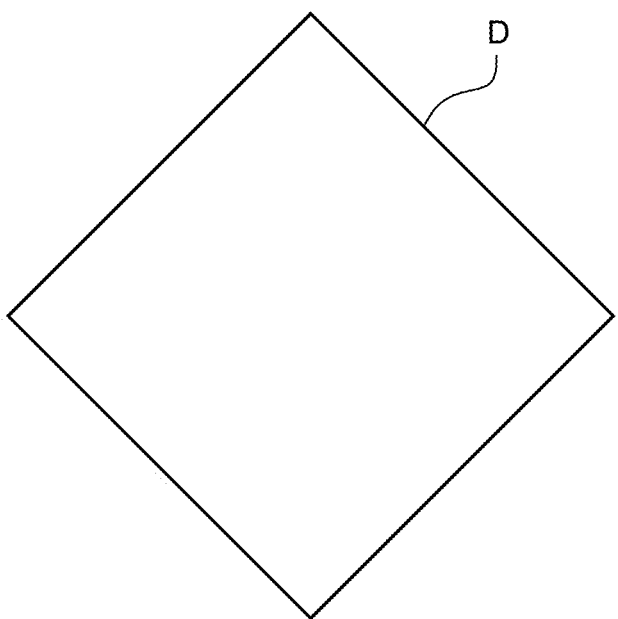
FIG. 3A is an example of object data.
Figure 3B:
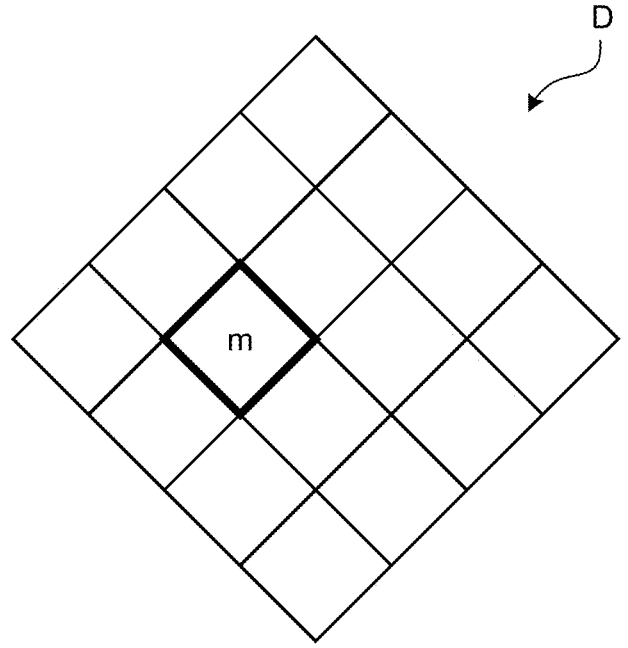
FIG. 3B is an example of randomly decomposing the object data into domains shown in FIG. 3A.
Figure 7A:
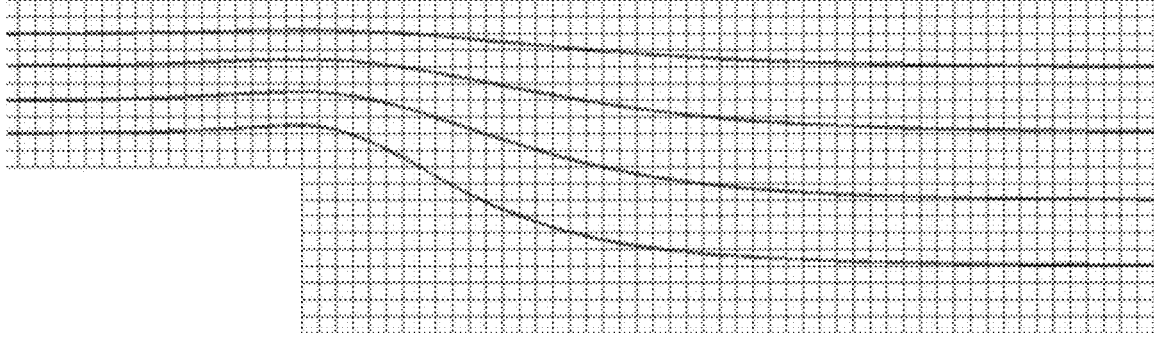
FIG. 7A shows an example of an embodiment of a first domain decomposition.

The first decomposition execution unit 331 executes a first decomposition execution step, and the information processing by software (stored in the storage unit 32) is specifically realized by hardware (controller 33). The first decomposition execution unit 331 executes the first mesh decomposition, which is preferably a random mesh decomposition, on the object data D (for example, the one shown in FIG. 3A) generated by the object data generation apparatus 2 and received via the communication unit 31. For simplicity, although the object data D is illustrated two-dimensionally here, it should be noted that the object data D is actually three-dimensional. Furthermore, it can be extended to n-dimensional object data D. In other words, the object data D is decomposed into a plurality of pre-meshes m, as shown in FIG. 3B. The first mesh decomposition is merely a random mesh decomposition, and is not limited to the one shown in FIG. 3B. Number of the pre-meshes m is also not limited, but may be determined appropriately to extent that the amount of calculation does not become enormous. See FIG. 7A for an example based on the first decomposition execution unit 331.

[Physical Operation Unit 332]

Figure 4:
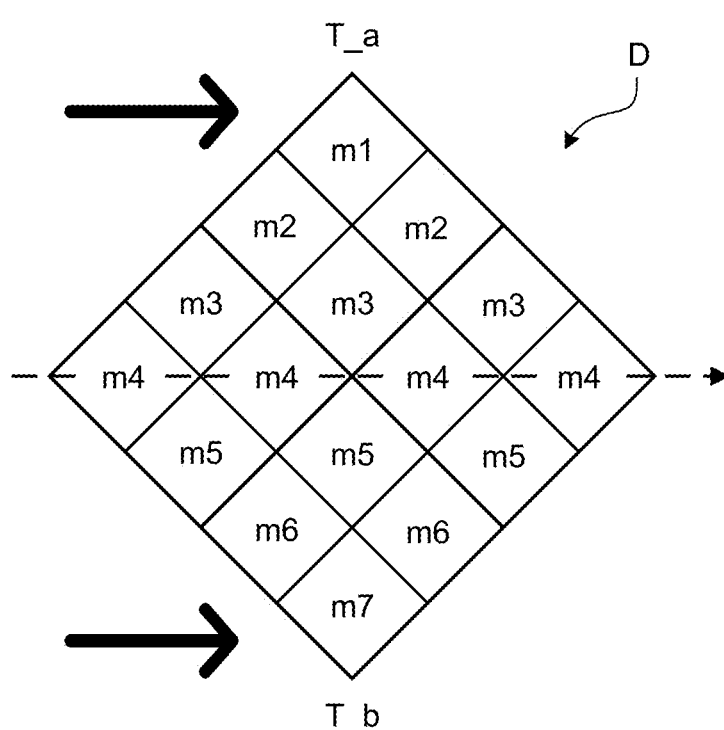
FIG. 4 shows an example of a physical operation executed on the object data decomposed into domains as shown in FIG. 3B.

The physical operation unit 332 executes the physical operation step, and information processing by software (stored in the storage unit 32) is specifically realized by hardware (controller 33). The physical operation unit 332 executes a physical operation on the object data D for which the first mesh decomposition is executed by the first decomposition execution unit 331. See FIG. 4 for an example showing the physical operation (simulation) executed on the object data D that is mesh decomposed as shown in FIG. 3B. In such example, a streaming water phenomenon is simulated from left side to right side in the drawing. In particular, it should be noted that above and below x-axis have separate temperatures of T_a degree (e.g., 100 degrees Celsius) and T_b degree (e.g., 0 degrees Celsius), respectively. When simulating such streaming water phenomenon, dispersion occurs in temperature of each pre-mesh m. For example, the pre-meshes m including domains having the same temperature are represented by the same number (m1 to m7).

Of course, the physical operation is not limited to such example illustrated above, the physical operation unit 332 may be configured to execute various physical operations (or configured of general governing equation) related to velocity, force, temperature, pressure, or the like.

[Second Decomposition Execution Unit 333]

Figure 5:
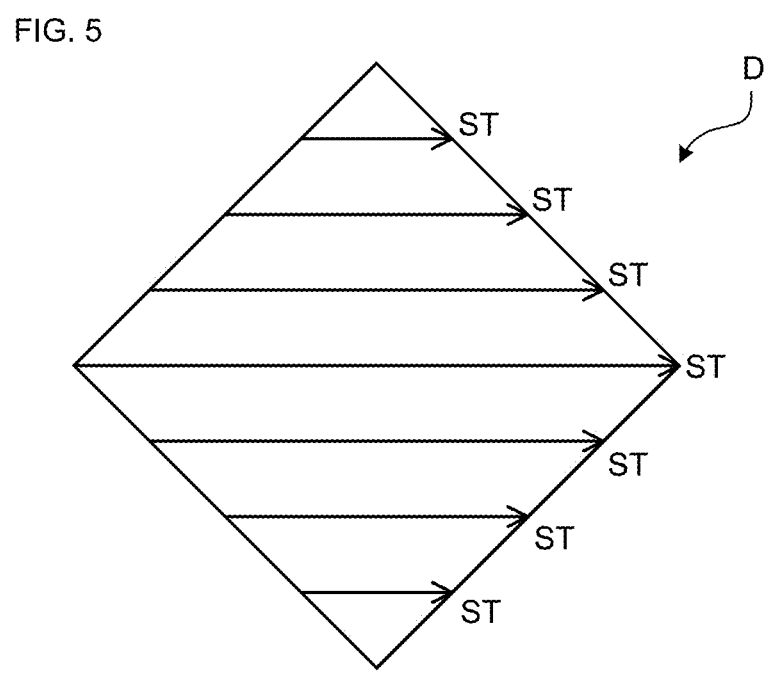
Figure 6:
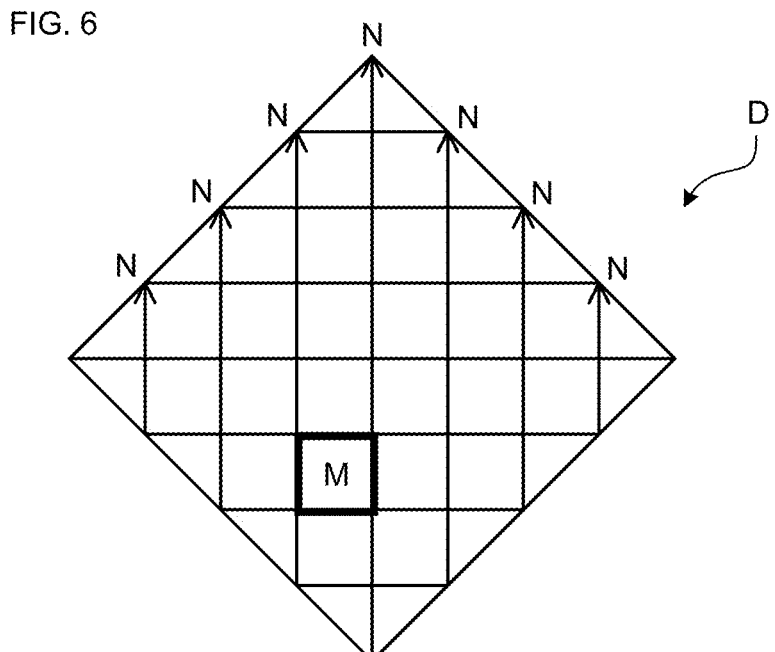
FIG. 6 shows a new mesh determined by drawing a perpendicular line to the streamline shown in FIG. 5.

The second decomposition execution unit 333 executes the second decomposition execution step, and information processing by software (stored in the storage unit 32) is specifically realized by hardware (controller 33). The second decomposition execution unit 333 determines a plurality of streamlines ST based on a result of the physical operation executed by the physical operation unit 332. The streamline ST is a curve (group) whose tangent line is velocity vector of a stream field at a certain moment. A stream tube or a stream surface may be adopted instead of the streamline ST. The stream tube is a curved surface surrounded by streamlines passing through each point on an arbitrary closed curve. The stream surface is a physical quantity corresponding to the streamline ST in three-dimensions. See FIG. 5 for an example in which the streamline ST is drawn based on the result of the physical operation shown in FIG. 4. Here, the streamline ST is the one connecting center of the pre-mesh m with the same number in FIG. 4. Then, the second decomposition execution unit 333 executes the second mesh decomposition based on the streamline ST. Preferably, the second decomposition execution unit 333 executes the second mesh decomposition based on the streamlines ST and the normal line N substantially perpendicular thereto. In other words, the object data D is decomposed into a plurality of new meshes M, as shown in FIG. 6. Such mesh M includes hexahedral element surrounded by the streamline ST and the normal line N. It should be noted that the mesh M obtained by such process is a highly accurate mesh M for which numerical diffusion is suppressed for physical operation. This is because numerical diffusion occurs in the first place when the stream is slanted to a grid line in a multi-dimensional problem, or when a dependent variable maintains a non-zero gradient in a direction perpendicular to the stream.

Figure 7B:
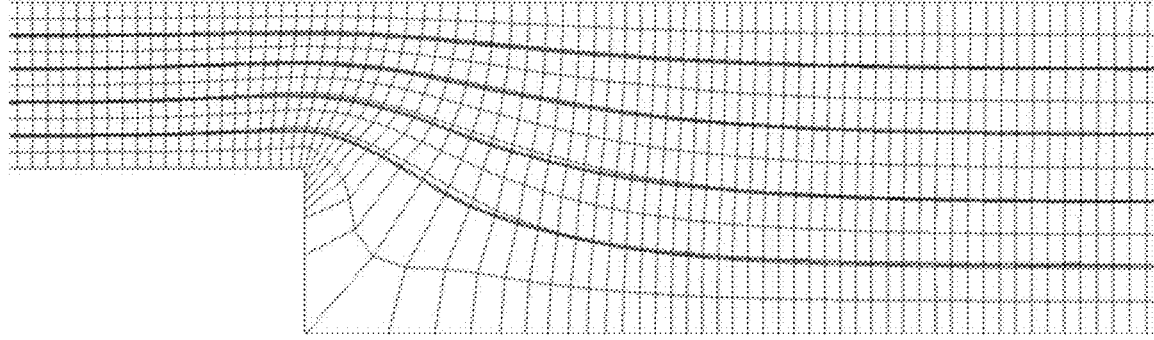
FIG. 7B shows an embodiment of a second domain decomposition.

Although a case in which the streamline is a straight line instead of a curved line is illustrated for the sake of simplicity, actually since shape of the object data D is complicated and the determination of the pre-mesh m is arbitrary, the streamline ST based on the result of the physical operation obtained by the physical operation unit 332 is usually a curve. See FIG. 7B for an example showing an embodiment based on the second decomposition execution unit 333.

Figure 8:
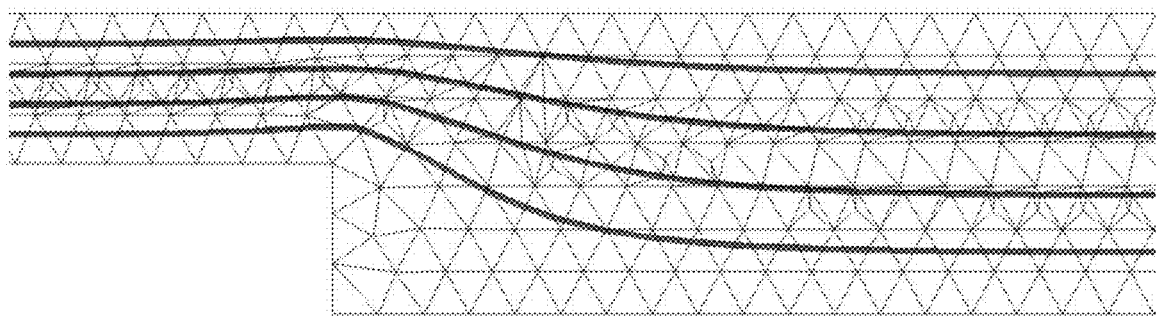
FIG. 8 shows another embodiment of domain decomposition.

See FIG. 8 for an example showing an embodiment in which the second decomposition execution unit 333 executes the second mesh decomposition along the streamline ST (or stream tube).

By the way, after the second mesh decomposition, a mesh M with higher accuracy can be obtained by further executing the physical operation on the decomposed mesh M and executing the second mesh decomposition. This can be executed repeatedly. In other words, it is preferable for the information processing apparatus 3 to execute mesh decomposition on the object data D by repeatedly executing the physical operation and the second mesh decomposition.

Although a sum of the number of times of the physical operation and of the second mesh decomposition is not particularly limited, it can be, for instance, 1 to 50 times, preferably 2 to 30 times, and more preferably 3 to 10 times. Specifically, for example, it may be 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50 times, or may be in a range between any two of the numerical values illustrated above.

<Display Unit 34>

For instance, the display unit 34 may be included in a container of the information processing apparatus 3 or may be externally attached. The display unit 34 displays a screen of a graphical user interface (GUI) that can be operated by a user U. For instance, it is preferable to use display devices such as CRT display, liquid crystal display, organic electroluminescence display, or plasma display properly according to type of the information processing apparatus 3. The display device may selectively display screen of the GUI in response to a predetermined control signal by the controller 33. As a supplement to the GUI, a specific interface such as an input form or a radio button may be displayed.

The display unit 34 displays the object data D received by the communication unit 31 from the object data generation apparatus 2. Further, the display unit 34 displays the highly accurate mesh M decomposed by the second decomposition execution unit 333 in the controller 33. Furthermore, a desired physical operation (simulation) may be implemented on the object data D configured of such mesh M, and result thereof may be displayed.

<Input Unit 35>

The input unit 35 may be included in the container of the information processing apparatus 3 or may be externally attached. For example, the input unit 35 can be implemented as a touch panel integrally with the display unit 34. As a touch panel, it is possible for the user U to input tap operation, swipe operation, or the like. Of course, switch button, mouse, QWERTY keyboard, or the like may be adopted instead of the touch panel. In other words, the input unit 35 receives some operation input. The input is transferred as an instruction signal to the controller 33 via the communication bus 30, and the controller 33 may execute a predetermined control or operation (e.g., simulation) as necessary.

2. Mesh Decomposition Method

Figure 9:
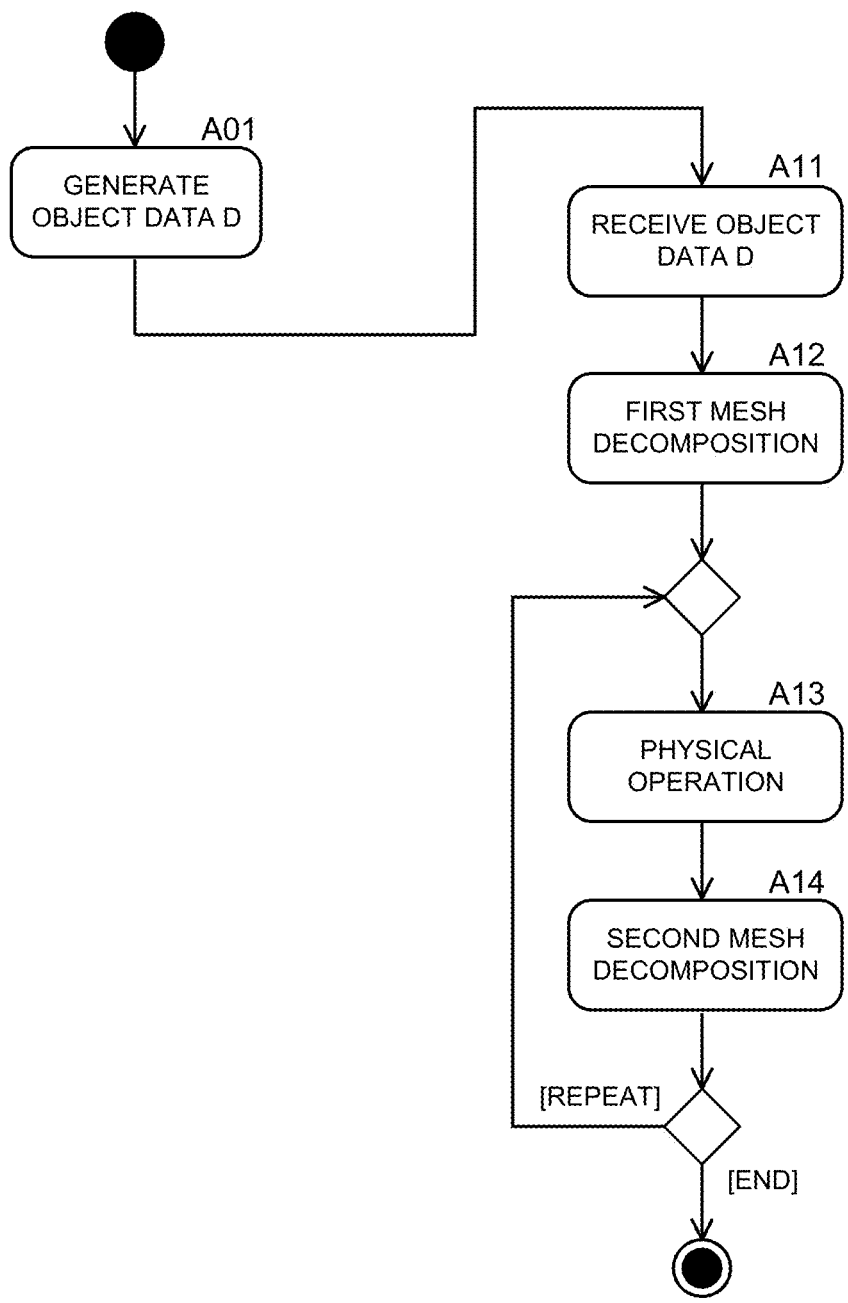
FIG. 9 is an activity diagram showing a domain decomposition method using the system.

In section 2, a mesh decomposition method realized by the system 1 according to the present embodiment will be described. FIG. 9 is an activity diagram showing a stream of operation of the system 1. Hereinafter, each activity in the activity diagram shown in FIG. 9 will be described.

[Start]

(Activity A01)

The object data generation apparatus 2 in system 1 generates the object data D. The generated object data D is transmitted to the information processing apparatus 3 via the network.

(Activity A11)

The communication unit 31 in the information processing apparatus 3 receives the object data D generated in the activity A01 (The object data D is received by the information processing apparatus 3).

(Activity A12)

After completion of the activity A11, the first decomposition execution unit 331 in the information processing apparatus 3 randomly decomposes the object data D received in the activity A11 into a plurality of pre-meshes M (first mesh decomposition).

(Activity A13)

After completion of the activity A12, the physical operation unit 332 in the information processing apparatus 3 executes physical operation on the object data D decomposed into the plurality of pre-meshes m in the activity A12.

(Activity A14)

After completion of the activity A13, the second decomposition execution unit 333 in the information processing apparatus 3 determines a plurality of the streamlines ST based on a result of the physical operation executed in the activity A13. Then, the second decomposition execution unit 333 decomposes the object data D into a plurality of the meshes M based on the streamline ST and the normal line N substantially perpendicular thereto (second mesh decomposition). The activity A13 and the activity A14 can be executed repeatedly until desired accuracy is obtained.

[End]

According to such method, it is possible to implement mesh decomposition with less dependency and more appropriateness. Specifically, the method has following advantages.

(Time)

Automatic domain decomposition becomes possible, which can greatly reduce time required for grid creation.

(Number of Elements)

Since coarseness and denseness of grid can be controlled based on curvature of the streamline and gradient of the known field, the number of meshes can be significantly reduced by automatically creating a grid with minimal numerical diffusion. Using information of the known field, it is also possible to place elements with large aspect ratio in a stream tube where there is little change in the field, thus number of unnecessary meshes can be reduced.

(Accuracy)

In final grid distribution, numerical diffusion is minimized, and a mathematical model that eliminates an error due to the numerical diffusion (compatibility) can be expressed. It is possible to decompose the domain by a cross section perpendicular to the streamline, and the grid can be arranged vertically, which improves quality of the elements. Regular element arrangement is possible in the stream tube, for instance, hexahedral element or polygonal element with the streamline as a sweep direction are easily to be arranged in a regular manner, local or global systematic mesh refinement becomes possible, and it is also possible to use Adaptive Mesh Refinement method that can be used by Richardson extrapolation so as to obtain a true value.

APPLICATION EXAMPLE 1. (a) Execute mesh decomposition on the domain with conventional method, (b) execute a streamline operation and define streamline, stream tube surface, and streamline vector plane (surface), and (c) execute domain decomposition on the domain at the surface obtained in (b), and execute the mesh decomposition.

2. (a) With the existing mesh defined in the domain, (b) execute streamline operation, and define streamline, stream tube surface, and streamline vector plane (surface), and (c) execute the mesh decomposition on the existing mesh by the mesh cutting at the surface obtained in (b).

3. Others

The system 1 according to the present embodiment may be further creatively devised according to following aspects.

(1) The object data generation apparatus 2 and the information processing apparatus 3 may be implemented in the same computer. In other words, the information processing apparatus 3 may implement generation of the object data D.

(2) A program that allows a computer to execute each step of the information processing apparatus may be implemented alone for business.

(3) The communication unit 31 receiving the object data D may be implemented as a reception unit that can read an external storage medium (for example, one in which the object data D is stored).

(4) Using the method, mesh cutting or other domain decomposition instead of mesh decomposition may be implemented.

(5) Streamline ST, stream tube or stream surface may include those that can be defined from gradient of any scalar or vector field.

(6) The domain may be decomposed based on level curve and/or level surface. In other words, it may be assumed that a surface is created by a group of level curves including offset processing, and the domain is decomposed by a surface obtained by sweeping a two-dimensional coordinating line in a vertical direction or the like.

(7) An information processing method may be provided. The information processing method is an information processing method for decomposing object data into domains. The information processing method comprises a first decomposition execution step, a physical operation step, and a second decomposition execution step. The object data is CAD data, polygon data, or mesh data of an object or a space, the domain decomposition is an operation of decomposing the object data into a plurality of domains. The first decomposition execution step is a step of executing a first domain decomposition, which is a random domain decomposition, on the object data. The physical operation step is a step of executing a physical operation on the object data for which the first domain decomposition is executed. The second decomposition execution step is a step of determining a plurality of stream tubes, streamlines, or stream surfaces based on a result of the physical operation. The second decomposition execution step is a step of executing a second domain decomposition based on the stream tube, the streamline, or the stream surface.

Furthermore, the present invention may be provided in each of the following aspects.

The information processing apparatus, wherein: the second decomposition execution step is a step of executing the second domain decomposition based on the stream tube, the streamline, or the stream surface, and a normal line or a surface substantially perpendicular thereto.

The information processing apparatus, wherein: the domain decomposition on the object data is executed by repeatedly executing the physical operation step and the second decomposition step.

The information processing apparatus, wherein: the physical operation step is a step of executing the physical operation with respect to a velocity, a force, a temperature, or a pressure.

The information processing apparatus, further: configured to execute a reception step of receiving the object data, comprising a storage unit configured to storage the object data received in the reception unit.

A program, allowing a computer to execute each step of the information processing apparatus.

An information processing method for decomposing object data into domains, the object data being CAD data, polygon data, or mesh data of an object or a space, a domain decomposition being an operation of decomposing the object data into a plurality of domains, the information processing method comprising: a first decomposition execution step of executing a first domain decomposition on the object data; a physical operation step of executing a physical operation on the object data for which the first domain decomposition is executed; and a second decomposition execution step of determining a plurality of stream tubes, streamlines, or stream surfaces based on a result of the physical operation, and executing a second domain decomposition based on the stream tube, the streamline, or the stream surface.

Of course, the above embodiments are not limited thereto.

Although various embodiments of the present invention have been described, these are presented as examples and are not intended to limit the scope of the invention. The novel embodiment can be implemented in various other forms, and various omissions, replacements, and changes can be made without departing from the abstract of the invention. The embodiment and its modifications are included in the scope and abstract of the invention and are included in the scope of the invention described in the claims and the equivalent scope thereof.

REFERENCE SIGNS LIST

1: System
2: Object data generation apparatus
3: Information processing apparatus
30: Communication bus
31: Communication unit
32: Storage unit
33: Controller
331: First decomposition execution unit
332: Physical operation unit
333: Second decomposition execution unit
34: Display unit
35: Input unit
D: Object data
m: Pre-mesh
M: Mesh
N: Normal line
ST: Streamline

What is claimed is:

1. An information processing apparatus comprising a processor configured to:
in a first decomposition execution step, execute a first random domain decomposition on the object data to produce a plurality of pre-meshes, wherein the object data are mesh data of an object;
in a physical operation step, execute a physical operation on the plurality of pre-meshes; and
in a second decomposition execution step,
determine a plurality of stream tubes, streamlines, or stream surfaces based on a result of the physical operation, and
execute a second domain decomposition based on the plurality of stream tubes, streamlines, or stream surfaces to produce a plurality of meshes, wherein coarseness and denseness of a grid are controlled based on curvature of the plurality of stream tubes, streamlines, or stream surfaces and a gradient of a known field to reduce the number of meshes.

2. The information processing apparatus according to claim 1, wherein: the processor is further configured to:
in the second decomposition execution step, execute the second domain decomposition based on the plurality of stream tubes, streamlines, or stream surfaces, and a normal line substantially perpendicular to the plurality of stream tubes, streamlines, or stream surfaces.

3. The information processing apparatus according to claim 1, wherein the processor is further configured to:
repeatedly execute the physical operation step and the second decomposition step.

4. The information processing apparatus according to claim 1, wherein the processor is further configured to:
execute the physical operation with respect to a velocity.

5. The information processing apparatus according to claim 1, wherein the processor is further configured to
receive the object data; and
store the object data received in the reception step.

6. An information processing method comprising:
a first decomposition execution step of executing a first domain decomposition on the object data to produce a plurality of pre-meshes, wherein the object data are mesh data of an object;
a physical operation step of executing a physical operation on the plurality of pre-meshes; and
a second decomposition execution step of
determining a plurality of stream tubes, streamlines, or stream surfaces based on a result of the physical operation, and
executing a second domain decomposition based on the plurality of stream tubes, streamlines, or stream surfaces to produce a plurality of meshes, wherein coarseness and denseness of a grid are controlled based on curvature of the plurality of stream tubes, streamlines, or stream surfaces and a gradient of a known field to reduce the number of meshes.

7. A non-transitory computer readable medium storing a program, allowing a computer to execute each step of the information processing method of claim 6.

8. The information processing method of claim 6, wherein the object data are three-dimensional.

9. The information processing method of claim 6, further comprising:
simulating a streaming water phenomenon.

10. The information processing method of claim 9, wherein dispersion occurs in a temperature of each pre-mesh of the plurality of pre-meshes.

11. The information processing method of claim 6, wherein each streamline of the plurality of streamlines is a curve whose tangent line is a velocity vector of a stream field at a certain moment.

12. The information processing method of claim 6, wherein each mesh of the plurality of meshes includes a hexahedral element surrounded by a respective streamline and a respective normal line.

\* \* \* \* \*